United States Patent [19]

Zagar et al.

[11] Patent Number: 5,677,884
[45] Date of Patent: Oct. 14, 1997

[54] CIRCUIT FOR CANCELLING AND REPLACING REDUNDANT ELEMENTS

[75] Inventors: Paul S. Zagar; Adrian E. Ong, both of Boise, Id.

[73] Assignee: Micron Technology, Inc., Boise, Id.

[21] Appl. No.: 816,203

[22] Filed: Feb. 28, 1997

Related U.S. Application Data

[63] Continuation of Ser. No. 417,007, Apr. 5, 1995, abandoned.

[51] Int. Cl.⁶ .................................................. G11C 7/00
[52] U.S. Cl. .................................................. 365/200; 365/96
[58] Field of Search .............................. 365/200, 96, 195

[56] References Cited

U.S. PATENT DOCUMENTS

| | | | |
|---|---|---|---|
| 4,514,830 | 4/1985 | Hagiwara et al. | 365/200 |
| 4,538,245 | 8/1985 | Smarandoiu | 365/185.09 |
| 4,935,899 | 6/1990 | Morigami | 365/200 |
| 5,148,391 | 9/1992 | Zagar | 365/96 |
| 5,200,652 | 4/1993 | Lee | 307/465 |
| 5,208,177 | 5/1993 | Lee | 437/47 |
| 5,233,206 | 8/1993 | Lee et al. | 257/50 |
| 5,238,862 | 8/1993 | Blalock et al. | 437/52 |
| 5,241,496 | 8/1993 | Lowrey et al. | 365/96 |
| 5,250,459 | 10/1993 | Lee | 437/52 |
| 5,282,158 | 1/1994 | Lee | 365/96 |
| 5,301,153 | 4/1994 | Johnson | 365/200 |
| 5,313,424 | 5/1994 | Adams et al. | 365/200 |
| 5,315,177 | 5/1994 | Zagar et al. | 307/465 |
| 5,325,334 | 6/1994 | Roh | 365/200 |
| 5,331,196 | 7/1994 | Lowrey et al. | 257/529 |
| 5,383,156 | 1/1995 | Komatsu | 365/200 |
| 5,412,593 | 5/1995 | Magel et al. | 365/96 |
| 5,446,695 | 8/1995 | Douse et al. | 365/222 |
| 5,517,455 | 5/1996 | McClure et al. | 365/225.7 |
| 5,532,966 | 7/1996 | Poteet et al. | 365/200 |

FOREIGN PATENT DOCUMENTS

| | | | |
|---|---|---|---|
| 209751 | 8/1990 | Japan | 365/225.7 |

*Primary Examiner*—A. Zarabian
*Attorney, Agent, or Firm*—Schwegman, Lundberg, Woessner & Kluth, P.A.

[57] ABSTRACT

In an integrated circuit having addressable primary elements and redundant elements which can be programmed to replace primary elements, a circuit and method are provided for cancelling and replacing redundant elements. A circuit is described which can be used in a memory such as a dynamic random access memory (DRAM) which uses a selectively blowable anti-fuse to disable a redundant element which was previously programmed to replace a defective primary element. The disclosure describes a method for permanently cancelling the defective redundant element and replacing the defective redundant element with another redundant element.

14 Claims, 5 Drawing Sheets

CIRCUIT FOR CANCELLING AND REPLACING REDUNDANT ELEMENTS

"This is a continuation of U.S. patent application Ser. No. 08/417,007 filed Apr. 5, 1995 now abandoned."

TECHNICAL FIELD OF THE INVENTION

The present invention relates generally to integrated circuits and in particular the present invention relates to cancelling and replacing redundant elements in integrated circuits.

BACKGROUND OF THE INVENTION

As the number of electronic elements contained on semiconductor integrated circuits continues to increase, the problems of reducing and eliminating defects in the elements becomes more difficult. To achieve higher population capacities, circuit designers strive to reduce the size of the individual elements to maximize available die real estate. The reduced size, however, makes these elements increasingly susceptible to defects caused by material impurities during fabrication. These defects can be identified upon completion of the integrated circuit fabrication by testing procedures, either at the semiconductor chip level or after complete packaging. Scrapping or discarding defective circuits is economically undesirable, particularly if only a small number of elements are actually defective.

Relying on zero defects in the fabrication of integrated circuits is an unrealistic option. To reduce the amount of semiconductor scrap, therefore, redundant elements are provided on the circuit. If a primary element is determined to be defective, a redundant element can be substituted for the defective element. Substantial reductions in scrap can be achieved by using redundant elements.

One type of integrated circuit device which uses redundant elements is electronic memory. Typical memory circuits comprise millions of equivalent memory cells arranged in addressable rows and columns. By providing redundant elements, either as rows or columns, defective primary rows or columns can be replaced. Thus, using redundant elements reduces scrap without substantially increasing the cost of the memory circuit.

Because the individual primary elements of a memory are separately addressable, replacing a defective element typically comprises blowing fuse-type circuits to 'program' a redundant element to respond to the address of the defective element. This process is very effective for permanently replacing defective primary elements. A problem with this process is the possibility of replacing a defective primary element with a defective redundant element. The possibility of having a defective redundant element increases as the number of redundant elements on an integrated circuit increases. Because the process of replacing defective elements is a permanent solution, if a defective redundant element is used, the circuit must be scrapped.

The number of redundant elements provided on a circuit usually exceeds the number of redundant elements needed to 'repair' a defective chip, therefore it would be desirable to replace the defective redundant element with another available redundant element.

For the reasons stated above, and for other reasons stated below which will become apparent to those skilled in the art upon reading and understanding the present specification, there is a need in the art for a circuit and method for cancelling and replacing defective redundant electronic elements on an integrated circuit.

SUMMARY OF THE INVENTION

The above mentioned problems with repairing defective redundant elements and other problems are addressed by the present invention and which will be understood by reading and studying the following specification. A circuit and method are described which provide for cancelling and replacing defective redundant elements in an integrated circuit, electronic memory or other electronic device.

In particular, the present invention describes an integrated circuit having a plurality of selectively addressable primary elements and a plurality of selectively programmable redundant elements. The integrated circuit comprises an enable circuit used for enabling one of the redundant elements, a program circuit for selectively programming the enabled redundant element. The programmed redundant element, therefore, can be used to replace a defective primary element. The integrated circuit also has a non-volatile disable circuit for disabling the enabled redundant elements.

In another embodiment, an integrated circuit memory array is described. The memory array has a plurality of selectively addressable primary memory elements and a plurality of selectively programmable redundant memory elements. The integrated circuit memory comprises an enable circuit for enabling one of the redundant memory elements, a program circuit for selectively programming the enabled redundant memory element to replace a defective primary memory element, and a non-volatile disable circuit for disabling the enabled redundant memory element.

In another embodiment, the enable circuit comprises a blowable fuse. One embodiment of the disable circuit comprises a latch circuit for indicating when an enabled redundant memory element is addressed, and a fuse circuit for producing an output used to disable the enabled redundant memory element. The fuse circuit can comprise a selectively blowable anti-fuse. The fuse circuit can alternatively comprise a high voltage P-channel transistor having its drain connected to a low voltage line, and an anti-fuse electrically connected between a variable voltage source and a source of the high voltage P-channel transistor.

Still another embodiment of the invention provides a method of repairing a selectively addressable defective primary element in an integrated circuit. The method comprises the steps of programming a first redundant element to respond to an address of the defective primary element and enabling the first redundant element. If the first redundant element is defective, the first redundant element is disabled and a second redundant element is programmed and enabled to respond to an address of the defective primary element. A method of cancelling a defective redundant element is also provided. To cancel a defective element, the defective redundant element is addresses and an anti-fuse circuit is selectively blown to permanently disable the redundant element.

A final embodiment provides a method of modifying an integrated circuit having a plurality of redundant elements. The method comprises the step of permanently replacing one redundant element with a second redundant element.

DETAILED DESCRIPTION OF THE INVENTION

In the following detailed description of the preferred embodiment, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

The present invention relates to integrated circuits such as memory circuits. In particular the present invention provides a circuit and method for cancelling and replacing a defective redundant element in an integrated circuit with another redundant element. One embodiment of the present invention is described as applied to a 64 megabit dynamic random access memory (DRAM). It will be understood that the invention is not limited to DRAM's, but can be equally applied to other memory devices such as video random access memories (VRAM) and static RAM (SRAM). Further, the present invention can be applied to any electronic circuit where primary and redundant circuitry is comprised of separately addressable elements.

A typical 64 megabit DRAM such as those available from Micron Technology Inc. of Boise, Idaho is comprised of addressable memory cells arranged in rows and columns. The memory has eight sections with each section comprised of eight sub-sections. Each sub-section having 1 megabits of memory arranged in 512 primary rows, or elements, and four redundant rows. Each of the rows contain 2048 addressable memory cells. Each primary row of the sections is uniquely addressable and any one of the rows in the DRAM can be addressed using twelve address lines. If a primary row is determined to be bad, it is known that a redundant row can be programmed to replace the defective row. This is accomplished by programming a redundant row to respond to the address of the defective primary row.

Each of the four redundant rows of each sub-section has a multi-bit comparison circuit module, or match fuse bank which is capable of receiving a multi-bit address signal in the form of a pre-coded signal. The match fuse bank is selectively programmable to respond to a specific address. Each match fuse bank evaluates the address signal and responds if the signal corresponds to the address of a defective primary row which it has been programmed to replace.

Figure 1:
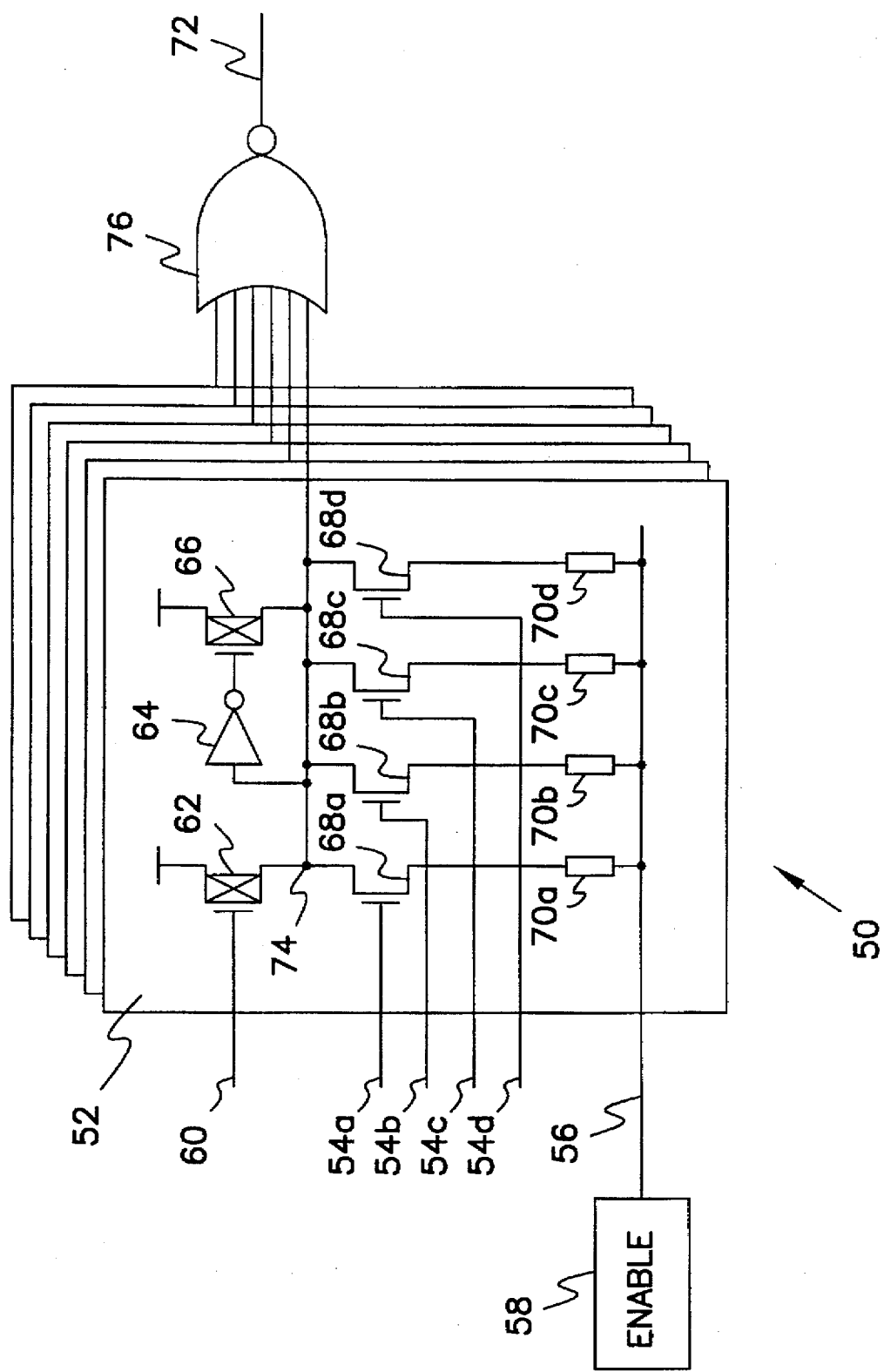
FIG. 1 is a match fuse bank associated with a redundant element.

Referring to FIG. 1, one way of programming a redundant element is the use of a match fuse bank circuit 50 corresponding to one of the 32 redundant rows of one section of the DRAM. The match fuse bank circuit is comprised of six sub-banks 52 each having four address inputs 54a–d (24 total), an enable input 56, enable circuit 58, and a pre-charge input line 60. Each sub-bank 52 has a set of four fuses 70a–d and a set of four transistors corresponding to the four address inputs. The fuses are selectively blown to program the match fuse bank to respond to the address of a defective primary row. If an address received on the twenty four address lines matches the programmed address, the match fuse bank produces a signal on output line 72 which is used to access the associated redundant row. This output is also used to disable the primary rows such that the defective primary row cannot respond to the address signal.

Fuses 70a–d in the match fuse bank 50 are selectively blow to replace a defective primary row with an available redundant row. The fuses are preferably laser fuses, but can be any fuse or static state maintaining device. By blowing three of the four fuses in each sub-bank the match fuse bank 50 can identify the address corresponding to a defective primary row of the associated section of the DRAM. That is, each sub-bank has four possible states. By combining the six sub-banks, a match fuse bank has $4^6$ or 4096 possible program combinations. These combinations correspond to the 4096 primary rows (8 sub-sections×512 primary rows) of the memory section.

In operation, enable circuit 58 which contains an enable fuse (not shown) is activated such that enable line 56 is permanently held low. It will be understood by those skilled in the art that any non-volatile circuit can be used to hold enable line 56 low. Assuming for example that fuses 70b–d have been selectively blown in the first sub-bank 52, the source of transistor 68a is electrically connected to enable line 56 through the un-blown fuse 70a. Before a match fuse bank can be addressed the pre-charge line 60 must be activated by pulsing the line low. The pre-charge line in turn activates p-type transistor 62 such that sub-bank output line 74 is pulled high. Transistor 62 must be shut off prior to addressing the match fuse bank. Inverter 64 activates p-type transistor 66 further holding line 74 high. When pre-charge line 60 returns high, the inverter 64 and transistor 66 latch line 74 high. NOR gate 76 produces a low output on match line 72 when any of the sub-bank output lines 74 are high. When an address is received by the match fuse bank 50 which matches the programmed address, transistor 68a is activated which pulls output line 74 low through non-blown fuse 70a. NOR gate 76 produces a high output on match line 72 if all six sub-blocks 52 receive the correct address on the four corresponding address lines 54a–d. The match line is used as described above to indicate that the redundant row has been addressed and that the primary row is to be deactivated.

It will be understood by those skilled in the art that this system can be adapted to other memories comprising a different number of primary elements by changing the number of fuses 70 in each sub-bank and changing the number of sub-banks 52 in each match fuse bank 50. Further, different redundant element schemes are contemplated by the present invention, such as redundant columns or cells.

Figure 2:
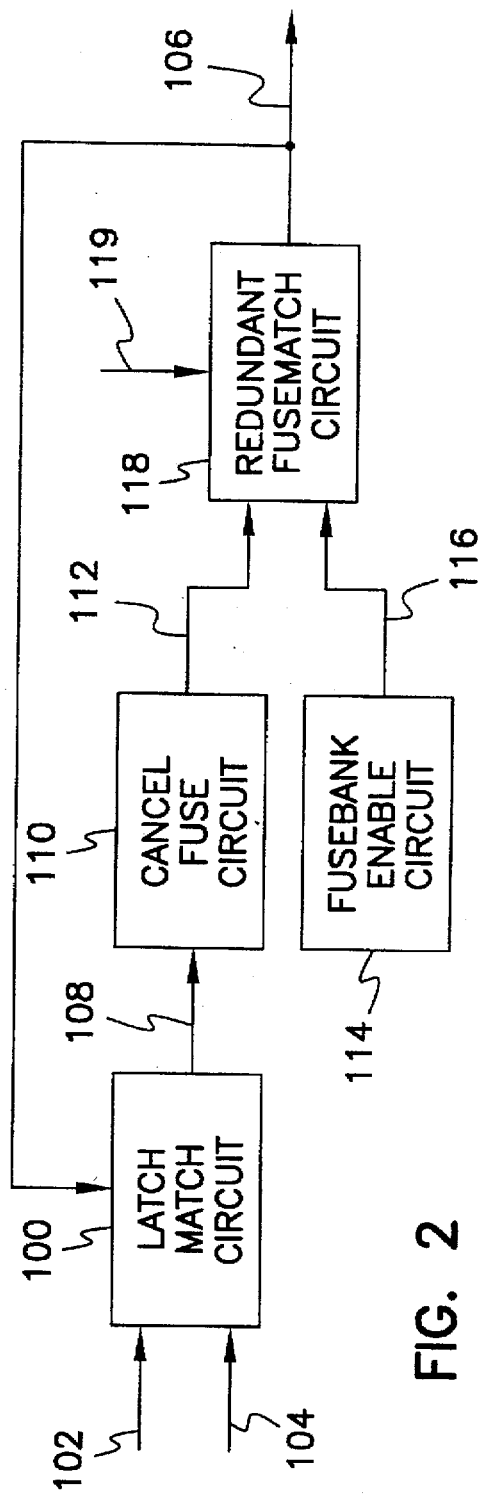
FIG. 2 is a block diagram of one embodiment of the present invention.

As detailed above, if a defective primary row was replaced or repaired with a defective redundant row the memory was traditionally discarded. The present invention, however, provides a tool for cancelling and replacing, or repairing, the defective redundant row with a second redundant row. Referring to FIG. 2, a block diagram of one embodiment of the present invention is described. Latch match circuit 100 has a latch match input line 102, an enable input line 104, and feedback from match output line 106. Output line 108 from the latch match circuit 100 is provided to cancel fuse circuit 110, which in turn provides an output line 112 to the redundant fuse match circuit 118. Fuse bank enable circuit 114 also provides an output line 116 to the redundant fuse match circuit 118. Fuse match circuit 118 has a pre-charge line input 119.

Figure 5:
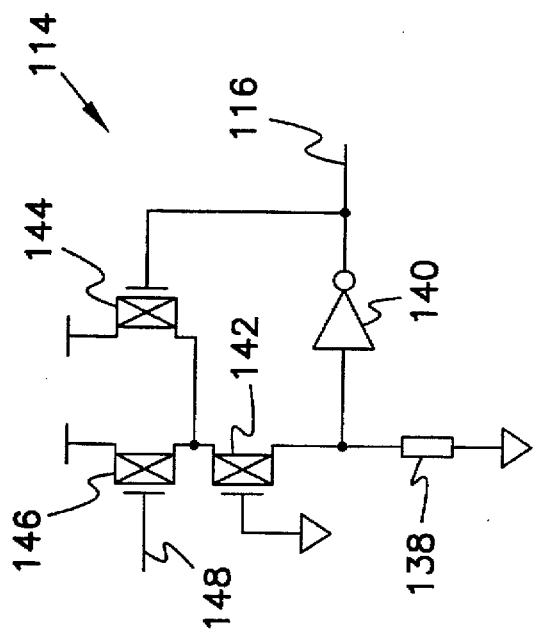
FIG. 5 is a schematic diagram of the fuse bank enable circuit of FIG. 2.
Figure 3:
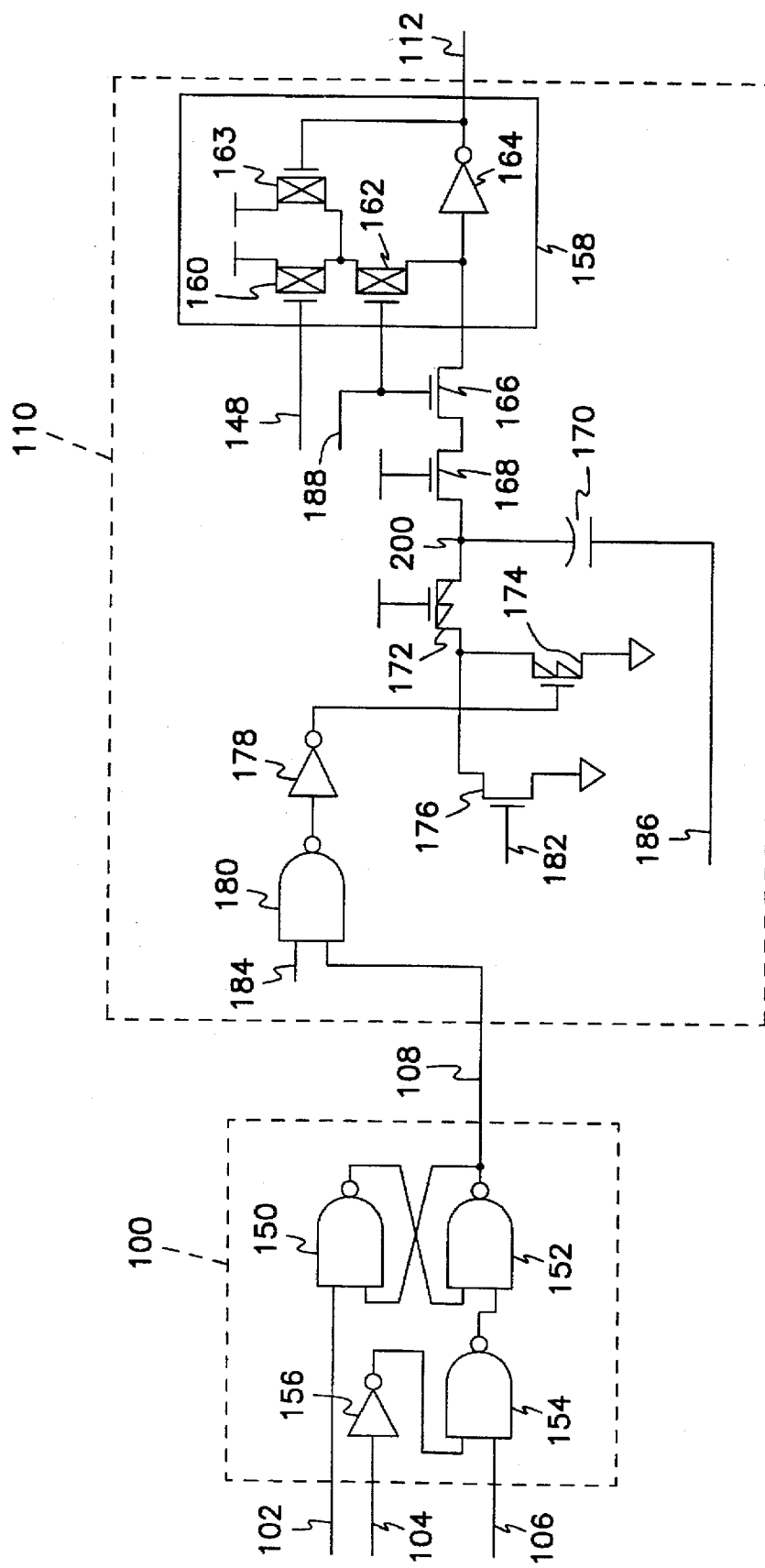
FIG. 3 is a schematic diagram of the latch match circuit and cancel fuse circuit of FIG. 2.
Figure 4:
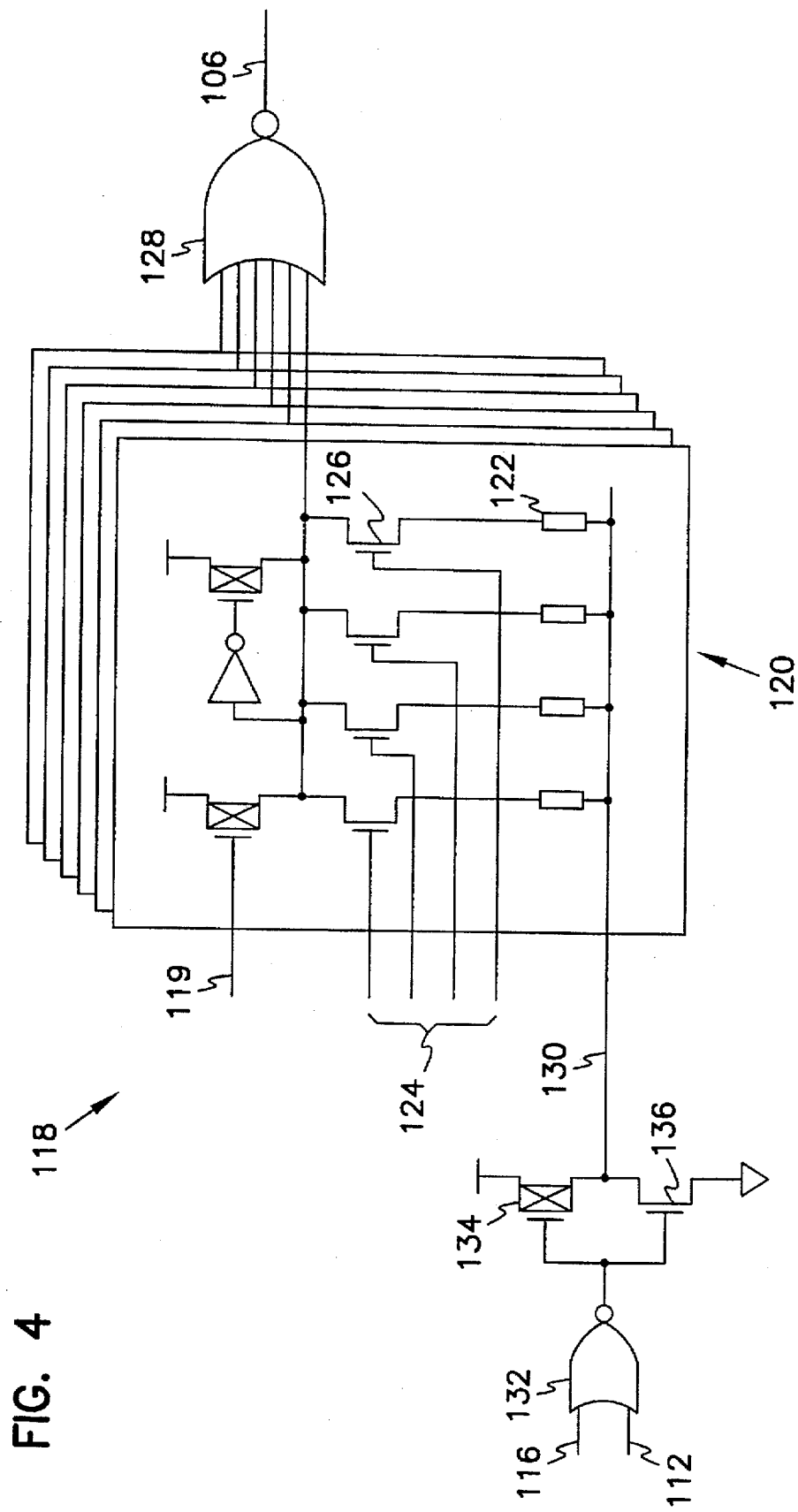
FIG. 4 is a redundant match fuse circuit incorporating features of one embodiment of the present invention.

Referring to FIGS. 3-5 the details of each circuit block are provided. As seen in FIG. 4, the redundant match fuse bank 120 is programmed as described above for match fuse bank 50 such that output 106 is used to enable a redundant row. That is, fuses 122 are selectively blown so that address lines 124 and transistors 126 control the NOR gate 128 to produce a high output on match output line 106. Line 130 must be held low to enable redundant match fuse block 120. This is accomplished by providing a low signal on both line 116 and 112 so that NOR gate 132 activates transistor 136. Line 112 is normally low, as described below. Line 116, however, is latched low using fuse bank enable circuit 114 (shown in FIG. 5) when a redundant fuse match circuit 118 is programmed.

Referring to FIG. 5, the fuse bank enable circuit 114 comprises a static latch circuit comprised of a one time blowable fuse 138, inverter 140, p-type transistors 142, 144, and 146, and an input line 148. In an inactivated state (prior to enabling the redundant element), fuse 138 is intact such that the input to inverter 140 is low and the output line 116 is high. As described above, redundant fuse match circuit 118 is disabled if line 116 is high. To enable a redundant fuse match circuit, therefore, fuse 138 is blown. As a result, transistor 146 is activated when input line 148 is pulsed low. The input to inverter 140 goes high through transistors 142 and 146 resulting in a low output on line 116. Transistor 144 is activated such that when input line 148 returns high the fuse match enable circuit is latched low.

If after a redundant row is determined to be defective after it has been enabled and programmed to replace a defective primary row, latch match circuit 100 and cancel fuse circuit 110 can be used to disable the redundant row. Referring to FIG. 3, latch match circuit 100 and cancel fuse circuit 110 are described in detail. Under normal enable conditions line 112, as described above, must be low so that the match fuse block 120 is enabled. Cancel fuse circuit 110 comprises a latch circuit 158 which insures that line 112 is latched low. Latch circuit 158 is activated by pulsing line 148 low to turn transistor 160 on, thus pulling the input to inverter 164 high and forcing output line 112 low. When line 148 returns high, output line 112 is latched low through transistors 162 and 163. Line 188 is normally biased at one half the supply voltage to activate both transistor 166 and transistor 162. It should be noted that transistor 162 is a long L device such that using a lower gate voltage on line 188 reduces the current flow through the transistor. Program/ground line 186 is normally grounded such that anti-fuse 170 stores a potential voltage, thereby, insuring that the input to inverter 164 remains high. Anti-fuse 170 is a DRAM nitride capacitor which is in essence a normal memory array cell used as a blowable capacitor. No extra process steps are therefore required in the fabrication of the DRAM to produce the anti-fuse. The anti-fuse is a one time blowable, or programmable, element which remains shorted when the circuit is powered down and re-powered up. It will be understood that any non-volatile element could be used to replace the anti-fuse to disable the redundant element. For a discussion of anti-fuses see U.S. Pat. No. 5,315,177 entitled "One Time Programmable Fully-Testable Programmable Logic Device with Zero Power and Anti-Fuse Cell Architecture" issued to Zagar et al. which is incorporated herein.

To disable or cancel a defective redundant row, latch circuit 158 must be set such that line 112 is permanently latched high. A five step operation is used to toggle and latch line 112 in a high state. The first step is to shut off transistor 166 by lowering line 188. This isolates latch circuit 158 from the anti-fuse. The second step is to pulse reset line 182 high so that any voltage stored on anti-fuse 170 is dissipated. The third step is to activate transistor 174. This step requires that both of the inputs to NAND gate 180 go high so that inverter 178 has a high output. While line 184 is a program cancel line and is held high during this step, output line 108 from the latch match circuit 100 must be raised as detailed below. The fourth step is to raise the voltage on program/ground line 186 until it exceeds the break down voltage of the anti-fuse 170 such that it permanently causing a short. The 64 megabit integrated circuit DRAM is preferably a 3.3 volt device. As such, a typical transistor cannot reliably handle the voltages needed to blow the anti-fuse (around 13 volts). That is, the p-n junction break down voltage of a typical transistor is near, or below, the voltage needed to break down the junction of the anti-fuse. Transistors 172 and 174 are, therefore, high voltage MOS transistors designed to handle relatively large potentials such that anti-fuse 170 is the "weak link". These transistors are fabricated using isolation techniques such as grounded gate, field isolation implant, or the like. It will be recognized by one skilled in the art that other fabrication techniques could be used to effectively increase the p-n junction breakdown voltage above that needed for the anti-fuse.

With the anti-fuse forming a short circuit, the fifth step is to return line 188 to its normal state so that the transistor 166 is activated and the input to inverter 164 goes low. As a result, line 112 is latched high to produce a low output from NOR gate 132. The NOR gate output turns transistor 136 off and activates transistor 134 to de-activate the match fuse bank 120.

The latch match circuit 100 comprises NAND gates 150, 152, and 154, and inverter 156. Prior to cancelling a redundant element, latch match input line 102 is low and enable input line 104 is high. However, when a defective redundant row is to be de-activated, as described above, latch match input line 102 is raised to a high state and enable input line 104 is lowered to a low state. To insure that the proper redundant row is de-activated, the defective redundant row is addressed using address lines 124 as described above. Match output line 106 goes high and output line 108 switches from a low state to a high state when the row is addresses, thereby, allowing the completion of the third step as detailed above.

Figure 6:
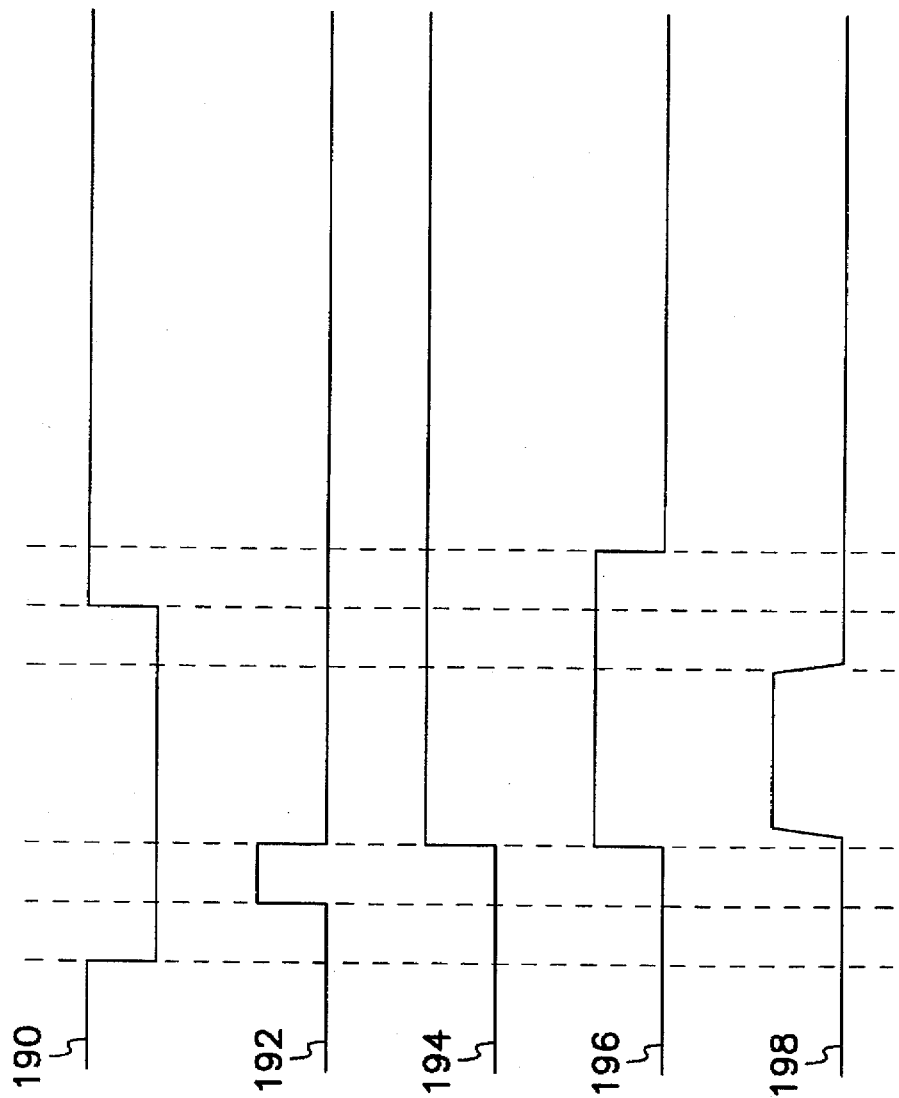
FIG. 6 is a timing diagram of the circuit of FIG. 2 being used to cancel a redundant element.

FIG. 6 illustrates the key steps to cancelling a redundant element. Timing diagram line 190 illustrates the signal on line 188 which goes low to isolate latch circuit 158 from the anti-fuse 170. Timing diagram line 192 illustrates the signal on line 182 which is pulsed high after line 188 goes low to discharge the anti-fuse. Match line 106 and line 184, illustrated by timing diagram lines 194 and 196, respectively, are both raised to activate transistor 174. Timing diagram line 198 shows the program/ground line 186 which is then raised to blow the anti-fuse. The timing diagram is not to scale and should not be taken as an indication of the exact voltage level on the individual lines. After the anti-fuse is blown, the program/ground line 186 returns low. As detailed above, the input to inverter 164 is connected to ground through the shorted anti-fuse 170 to permanently disable the match fuse bank 120.

Once the anti-fuse 170 is blown, the defective match fuse bank 120 is permanently disabled and cannot be addressed by address lines 124. A second redundant row can, therefore, be activated and programmed to respond to the address of the defective primary row, as detailed above using the match fuse block.

SUMMARY

The present invention provides a circuit and method for cancelling a redundant element of an integrated circuit. This invention can be provided in any integrated circuit having addressable primary elements and selectively addressable redundant elements. The invention provides a circuit and method for permanently disabling a defective redundant element which was previously enabled. A second redundant element, therefore, can be used to replace the defective element.

What is claimed is:

1. An integrated circuit having a plurality of selectively addressable primary elements and a plurality of selectively programmable redundant elements, the integrated circuit comprising;

a redundant element enable circuit connected to one of the plurality of selectively programmable redundant elements;

a redundant element program circuit connected to the one of the plurality of selectively programmable redundant elements and used to selectively program the one of the plurality of selectively programmable redundant elements to replace a defective one of the plurality of selectively addressable primary elements; and a non-volatile redundant element disable circuit connected to the redundant element enable circuit, the non-volatile redundant element disable circuit adopted to disable the one of the plurality of selectively programmable redundant elements.

2. The integrated circuit of claim 1 where the integrated circuit comprises an integrated circuit memory array, and the plurality of selectively addressable primary elements are a plurality of selectively addressable primary memory elements and the plurality of selectively programmable redundant elements are a plurality of selectively programmable redundant memory elements.

3. The integrated circuit of claim 1 where the non-volatile redundant element disable circuit comprises a selectively blowable fuse.

4. The integrated circuit of claim 1 where the non-volatile redundant element disable circuit comprises;

a latch circuit which produces an output that indicates when an enabled one of the plurality of selectively programmable redundant elements is addressed; and a fuse circuit which produces a pre-determined output used to permanently disable the enabled one of the plurality of selectively addressable redundant elements.

5. The integrated circuit of claim 4 where the fuse circuit comprises a selectively blowable anti-fuse.

6. The integrated circuit of claim 4 where the fuse circuit comprises a selectively blowable anti-fuse electrically connected to a low voltage level through at least one high voltage transistor.

7. The integrated circuit of claim 6 where the at least one high voltage transistor is fabricated using a field isolation implant technique.

8. An integrated circuit memory array having a plurality of selectively addressable primary memory elements and a plurality of selectively programmable redundant memory elements, the integrated circuit memory comprising;

a non-volatile redundant memory element enable circuit connected to one of the plurality of selectively programmable redundant elements;

a redundant element program circuit connected to the one of the plurality of selectively programmable redundant memory elements and used to selectively program the one of the plurality of selectively programmable redundant memory elements to replace a defective one of the plurality of selectively addressable primary memory elements; and a non-volatile redundant memory element disable circuit connected to the non-volatile redundant memory element enable circuit, the non-volatile redundant memory element disable circuit adapted to disable the one of the plurality of selectively programmable redundant memory elements.

9. The integrated circuit memory array of claim 8 where the non-volatile redundant memory element enable circuit comprises a selectively blowable fuse.

10. The integrated circuit memory array of claim 8 where the disable circuit comprises;

a latch circuit which produces an output that indicates when an enabled one of the plurality of selectively programmable redundant memory elements is addressed; and a fuse circuit which produces a pre-determined output used to permanently disable the enabled one of the plurality of selectively programmable redundant memory elements.

11. The integrated circuit memory array of claim 10 where the fuse circuit comprises a selectively blowable anti-fuse.

12. The integrated circuit memory array of claim 10 where the fuse circuit comprises a selectively blowable anti-fuse electrically connected to a low voltage level through at least one high voltage transistor.

13. The integrated circuit of claim 12 where the at least one high voltage transistor is fabricated using a field isolation implant technique.

14. The integrated circuit memory array of claim 8 where the redundant element program circuit comprises;

a plurality of address line inputs; and a plurality of selectively blowable fuses associated with the plurality of address line inputs which allow the redundant element program circuit to respond to a pre-determined address provided on the plurality of address line inputs.

* * * * *